US005275689A

United States Patent [19]

Felten et al.

[11] Patent Number: 5,275,689

[45] Date of Patent: Jan. 4, 1994

[54] METHOD AND COMPOSITIONS FOR DIFFUSION PATTERNING

[75] Inventors: John J. Felten, Chapel Hill, N.C.; Walter R. Hertler, Kennett Square; Sheau-Hwa Ma, Chadds Ford, both of Pa.

[73] Assignee: E. I. Du Pont de Nemours and Company, Wilmington, Del.

[21] Appl. No.: 790,863

[22] Filed: Nov. 14, 1991

[51] Int. Cl.[5] .......................... B05D 5/00; B29C 37/00

[52] U.S. Cl. .................................... 156/628; 156/635; 156/659.1; 156/668; 156/904

[58] Field of Search ..................... 156/628, 668, 659.1, 156/635, 904; 430/270, 325, 326

[56] References Cited

U.S. PATENT DOCUMENTS 4,663,186 5/1987 Indyk et al. .................... 156/904 X
5,019,488 5/1991 Mammato et al. .................. 430/325
5,032,216 7/1991 Felten ................................. 156/628
5,039,596 8/1991 Wu et al. ............................ 430/326

FOREIGN PATENT DOCUMENTS 0451741 10/1991 European Pat. Off. .
9106118 2/1991 PCT Int'l Appl. .

*Primary Examiner*—Thi Dang

[57] ABSTRACT

Method for patterning organic polymer layers comprising the sequential steps:

A. Applying to a substrate an unpatterned layer of solid acid labile polymer;

B. Applying to the unpatterned layer a patterned second layer comprising a liquid solution of organic acid and volatile solvent;

C. Heating the patterned layer to effect removal of the volatile solvent from the layer and diffusion of the organic acid into the underlying areas of the first layer; and D. Washing the layers with aqueous base solution to remove the solubilized acid labile polymer from the patterned areas of the layers.

13 Claims, 1 Drawing Sheet

METHOD AND COMPOSITIONS FOR DIFFUSION PATTERNING

FIELD OF INVENTION

The invention is directed to a method for diffusion patterning of organic polymer films and to polymeric compositions which are especially suitable for patterning by that method.

BACKGROUND OF INVENTION

Thick film technology has historically been an attractive method of producing conductors, dielectrics and resistors that are rugged and reliable. The technology is well suited for economical production of short production runs. Its ability to be patterned in multilayer configurations has allowed fabrication of devices with namely high circuit density. The successive levels of conductors in the multilayer structure are separated by insulating dielectric layers and are interconnected by vias through the dielectric layers.

The multilayer approach is more expensive than a single layer approach because it requires painstaking inspection, realignment between the layers, and careful processing to avoid blistering and cracking.

The most obvious way to reduce these problems associated with multilayer production is to reduce line and space dimensions, thereby reducing the number of layers in a given structure. The problem with this approach has been the limited resolution capability of thick film screen printing, which limits the size of vias used to connect layers of circuitry to 10 to 15 mils diameter. Likewise, conductors are limited to a narrowest line width and spacing of 5 to 7 mil lines and spaces in production quantities.

Many different approaches have been tried to obtain finer pitch lines and smaller vias. Extremely fine screen mesh and improved emulsion backing have allowed line resolution of as low as four mils line/space to be obtained in limited production. Photoformable pastes have been developed that allow five mil or finer vias, and two to three mil line/space pitch. Thick film metallizations have also been patterned with photoresists and etched to produce fine line patterns and thin film conductors have been plated up to produce fine line patterns with high conductivity.

All the above approaches have associated drawbacks. For example, fine mesh screens typically lay down thinner conductor and dielectric layers than are desirable. Photoformable pastes have a larger amount of organic matter that increases shrinkage during firing and can produce dirty burnout that may render fired parts useless. Conductors produced with photoformable pastes have an undesirable edge curl that can reduce the reliability of circuits fabricated with them. The processes that require etch, photoresists or plating are lengthy, process-sensitive and expensive. Furthermore, some of the processes use solvent that is difficult to handle. Accordingly, the need continues for a fast, environmentally safe method for making high resolution images in polymer films, and particularly in thick films, that avoids the above mentioned problems.

SUMMARY OF INVENTION

In a first aspect, the invention is directed to a method for making images on polymer-containing films comprising the sequential steps of:

A. Applying to a substrate an unpatterned first layer comprising a solid acid labile polymer;

B. Applying to the unpatterned first layer a patterned second layer comprising a liquid solution of organic acid and volatile solvent;

C. Heating the patterned second layer to effect removal of the volatile solvent from the layer and diffusion of the organic acid into the underlying areas of the first layer whereby the acid labile polymer in the underlying areas of the first layer becomes solubilized by reaction with the organic acid; and D. Washing the layers with aqueous basic solution having a pH of least 7 to remove the solubilized acid labile polymer and plasticizer from the patterned areas of the layers.

In a second aspect, the invention is directed to a thick film dielectric composition for use as the unpatterned first layer in a diffusion patterning process comprising:

A. finely divided particles of inorganic dielectric solids dispersed in:

B. a liquid organic medium comprising a solution of:

(1) film-forming acid labile polymer;

(2) plasticizer in which the acid labile polymer is incompletely soluble; and (3) volatile organic solvent, the ratio of polymer to plasticizer being such that, when the volatile organic solvent is removed from the organic medium, the resulting solvent-free polymer/plasticizer dispersion is specularly nonreflective.

In a third aspect, the invention is directed to a method for making patterns in organic polymer layers comprising the sequential steps:

A. Applying to a substrate an unpatterned first layer comprising a solid organic polymer and an acid labile plasticizer;

B. Applying to the unpatterned first layer a patterned second layer comprising a liquid solution of organic acid and volatile solvent;

C. Heating the patterned second layer to effect removal of the volatile solvent from the layer and diffusion of the plasticizer and organic acid into the underlying areas of the first layer whereby the organic polymer therein becomes further solubilized by the diffused plasticizer and the acid labile plasticizer therein becomes solubilized by reaction with the organic acid; and D. Washing the layers with aqueous solution having a pH of at least 7 to remove the solubilized acid labile plasticizer and polymer from the patterned areas of the layers.

BRIEF DESCRIPTION OF THE DRAWING

The Drawing consists of FIGS. 1*a*–1*f* which illustrate schematically the separate steps of the invention when it is used to pattern a thick film paste.

DETAILED DESCRIPTION OF THE INVENTION

A. Definitions

Figure 1A:
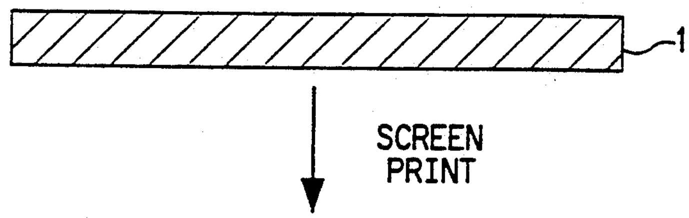

As used herein the following terms have the indicated meanings:

The term "eluant" refers to any fluid, either liquid or gaseous, which is capable of dissolving or otherwise placing the underlying unpatterned layer into a dispersible form. As applied to the invention, the eluant is aqueous.

The term "dispersible" means with respect to a film of given material that the material is capable of displacement or removal by physical and/or chemical action of a wash liquid. As applied to the invention, the wash liquid is aqueous.

The term "volatile solvent" refers to liquid organic solvents which can be removed from the unpatterned first layer by heating to 120 C. or less at atmospheric pressure.

The term "non-crystalline polymer" refers to solid organic polymers having no more than about 50% crystallinity.

The term "acid labile group" refers to a labile group which is rendered nonreactive to aqueous bases by the protection of an associated functional moiety, which moiety is readily removable by reaction with acids, thus deprotecting the labile group and rendering it amenable to reaction with aqueous bases.

The term "acid labile polymer" refers to an aqueous base-insoluble solid organic polymer which contains a plurality of acid labile groups which are either in the backbone of the polymer directly or indirectly pendantly attached along the polymer backbone in sufficient number to render the polymer soluble in dilute aqueous base solutions or water when the protective moieties are removed from the acid labile groups by reaction with acids. Polymers cross-linked with acid labile groups can also be used.

The term "acid labile plasticizer" refers to an aqueous base-insoluble normally liquid nonvolatile organic compound which contains at least one acid labile group and which is a solvent for a given solid organic polymer, the compound being rendered soluble in dilute aqueous basic solutions when the protective moiety is removed from the acid labile groups by reaction with acids.

The term "solvent free" refers to compositions from which volatile solvent has been removed substantially completely, i.e. any residual amount of solvent is less than about 1% by weight of the remaining composition.

The terms "acrylate" and "acrylic" as used herein to describe monomers and polymers include methacrylates as well as acrylates.

All proportions are by weight unless it is otherwise indicated.

B. Detailed Description of the Drawing

Figure 1B:
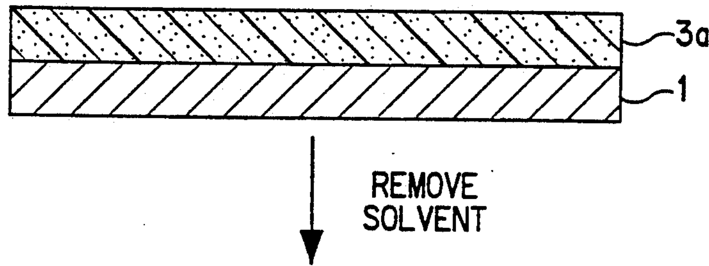
Figure 1C:
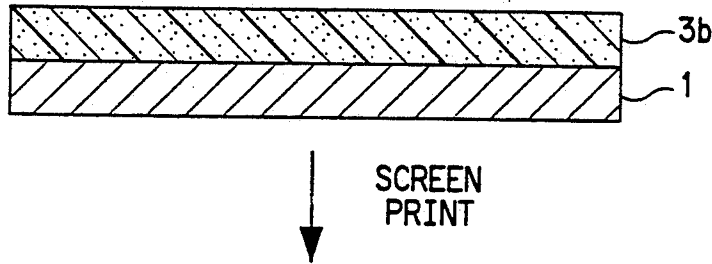
Figure 1D:
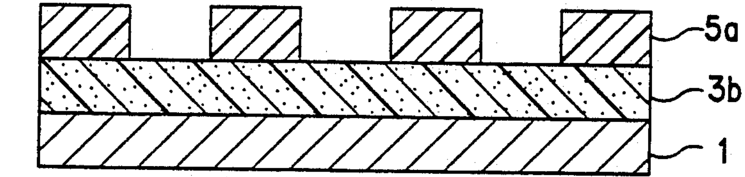
Figure 1E:
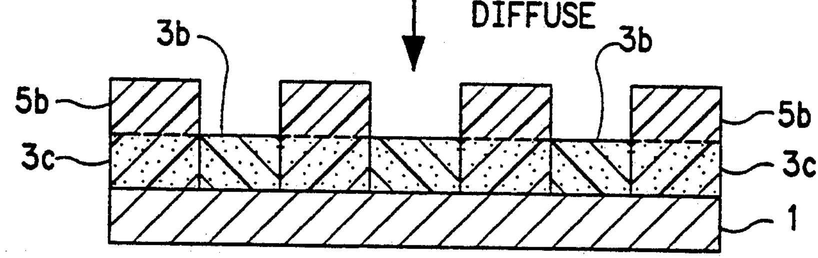
Figure 1F:
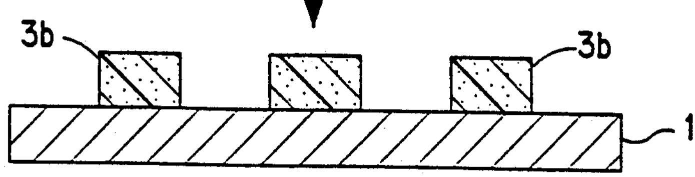

The diffusion patterning process can more easily be appreciated by reference to FIGS. 1*a*–1*f*, which illustrate schematically the separate steps of the process as it is applied to the patterning of thick film dielectric paste.

A layer of thick film dielectric paste 3*a* is applied by screen printing to alumina substrate 1. The thick film paste is comprised of finely divided particles of glass dispersed in an organic medium comprising an acid labile polymer dissolved in dibutyl phthalate plasticizer and terpineol. After printing the layer 3*a*, the terpineol is removed by heating the layer to a temperature of 80 C. for a period of about 10 minutes.

A patterned second layer 5*a* is screen printed over the solvent-free thick film layer 3*b*, the second layer is a liquid solution comprised of p-toluene sulfonic acid, dibutyl phthalate and terpineol.

Upon forming the patterned layer 5*a*, the assemblage is heated to 90 C. during which the terpineol is evaporated from the layer and the acid and dibutyl phthalate are diffused into the underlying areas of thick film dielectric layer 3*b* whereby the acid reacts with the acid labile groups of the polymer to render it water dispersible.

The patterned layer 5*b* consists mainly of small amounts of residual acid and dibutyl phthalate. It is then washed with water having a pH of at least 7 to remove the underlying diffusion patterned layer 5*b*, which consists largely of the solubilized acid labile polymer and the other materials in the underlying imaged areas of thick film layer 3*b*. Upon completion of the washing, the surface of substrate 1 is exposed in the areas which underlay the pattern of layer 3*c* and a very precise negative image of the pattern remains on the surface of substrate 1.

C. Substrate

The method of the invention can be used on either inorganic substrates, such as $Al_2O_3$, $SiO_2$, silicon, AlN and the like, or organic substrates, such as polyimides, phenoxy resins, epoxy resins and the like, or composite substrates such as filled organic polymers. When the method of the invention is used for making thick film layers, upon completion of the washing step, the patterned thick film layer is fired to burn off the organic constituents of the layer and to effect densification or sintering of the finely divided solid particles.

D. Acid Labile Polymer

The binder component of the unpatterned first layer, irrespective of the manner in which it is applied, must be film forming, non-crystalline and must be an acid labile polymer as described hereinabove. While the molecular weight or glass transition temperature ($T_g$) of the polymer is not of itself critical, it is preferred that the $T_g$ be at least 50 C. and preferably 70C or higher in order that less of the polymer can be used in the layer. Non-crystallinity of the acid labile polymer is essential in order to facilitate diffusion of both the plasticizer and the liquid base solution from the patterned layer into the thick film layer. So long as they meet the above three criteria, a wide variety of acid labile polymers can be used as the binder material for the unpatterned first layer of the invention.

The primary function of the unpatterned first layer is to serve as a dielectric for multilayer electronic circuits. When the dielectric layers of the multilayer are themselves organic, the polymer itself serves the dielectric function. But when the layer is a thick film, the polymer serves as binder for the dielectric solid particles until the layer is fired.

The purpose of the acid labile functionality of the polymer molecule is to make the areas of the dielectric layer which underlie the pattern dispersible by reaction with aqueous basic solutions after diffusion of the acids from the patterned layer in the polymer. As mentioned hereinabove, it is necessary that the number of these acid labile groups be sufficient to make the polymer dispersible in water upon exposure to the acid from the patterned layer. It has been found that a pH of at least 7 is sufficient for this purpose. A pH of at least 9 is ordinarily preferred. However, it is essential that the polymer not be water dispersible before the deprotecting reaction.

Suitable acid labile polymers include 1) polymers having acrylic, vinyl, polyester and polyurethane backbones and pendant acid labile carboxylic esters such as alpha-alkoxy alkyl esters, secondary or tertiary alkyl esters, silyl esters or pendant acid labile esters of other acids such as sulfonic acid, sulfinic acid, and phosphonic acid; 2) polymers in which the back bone is acid labile such as the polymers described in *Polymeric Material Science And Engineering*, 60, p. 170–178, 1989; and 3) polymers which are crosslinked with acid labile groups such as the polymers disclosed by Reiser et.al., U.S. Ser. No. 07/421,546 (filed Oct. 13, 1989). Polymers which are crosslinked with acid labile groups may also have additional acid labile groups.

Preferred are homopolymers and copolymers of acid-labile acrylate and acid-labile styrene monomers. Preferred acid labile groups include alpha-alkoxy alkyl esters, represented by the formula:

$$-CO_2-C(R^1)(OR^2)-CH(R^3)(R^4),$$

wherein $R^1$ is hydrogen or alkyl;

$R^2$ is alkyl; and $R^3$ and $R^4$ are each independently hydrogen or alkyl and $R^1$ and $R^2$, $R^1$ and either $R^3$ or $R^4$ when taken together form a 5-, 6-or 7-membered ring.

and secondary or tertiary alkyl esters, represented by the formula:

$$-CO_2-C(R^5)(R^6)(R^7),$$

wherein $R^5$ is H, alkyl, e.g., $C_1$–$C_{12}$; alpha, beta-unsaurated alkenyl, e.g., $C_1$–$C_{12}$; aryl, e.g., $C_6$–$C_{30}$; substituted aryl, e.g., alkoxy $C_1$ to $C_6$, etc.

$R^6$ is H, alkyl, alkenyl, aryl, substituted aryl (see $R^5$)

$R^7$ is alkyl, alkenyl aryl, substituted aryl (see $R^5$)

wherein, the definition of aryl and alkyl includes the joining of $R^5$ and either $R^6$ or $R^7$ or $R^6$ with $R^7$ to form a 5, 6 or 7 membered ring.

A more preferred polymer is poly(tetrahydropyranyl acrylate), polyTHPA, because this polymer has a low $T_g$. The unpatterned layer formed from this polymer resists cracking when coated on a flexible support. The deprotected polymer, poly(acrylic acid), is soluble in tap water.

The acid-labile group may be bound directly to the polymer backbone with no intervening atoms, such as in polyTHPMA, a homopolymer of tetrahydropyranyl methacrylate, and polyTHPA. One or more additional atoms may be present between the acid-labile group and the polymer backbone. An example of such indirect bonding is a polystyrene in which the acid-labile groups are attached to the aromatic rings of the polystyrene.

Properties of the acid-labile polymer may be controlled by the choice of monomers and manner of polymerization. The polymer may be a homopolymer, a random or block copolymer, a terpolymer, or a higher polymer of various acid-labile monomers. The copolymers and higher polymers may also contain conventional non-acid-labile monomers, such as methyl methacrylate, ethyl methacrylate, furfuryl methacrylate, benzyl methacrylate, and styrene. Small amounts (typically less than 5 mol %) of glycidyl methacrylate or similar monomers may be included to promote adhesion to the substrate.

For efficient washout by water or aqueous base (such as 0.4N aqueous sodium hydroxide), it is preferred that the polymer backbone have at least about 50 mol % recurring units of an acid-labile monomer or monomers. An example is 50:50 poly(THPMA/FMA), a copolymer containing 50 mol % of tetrahydropyranyl methacrylate and 50 mol % of furfuryl methacrylate. Polymers consisting essentially of recurring units of one or more acid-labile acrylate and/or methacrylate monomers are particularly useful. Examples are poly(EPMA), a homopolymer of 1-ethoxy-1-propyl methacrylate, and 59:41 poly(THPMA/THPA), a copolymer containing 59 mol % tetrahydropyranyl methacrylate and 41 mol % of tetrahydropyranyl acrylate.

Acid-labile polymers may be prepared by (1) polymerization of acid-labile monomers using conventional polymerization techniques or (2) derivatization of a preformed polymer, such as by acid catalyzed reaction of a polymer containing carboxylic acid and/or ester groups with vinyl ethers. Acid-labile monomers may be prepared by conventional synthesis techniques. An example is acid catalyzed reaction of methacrylic acid with an alkyl vinyl ether, such as, ethyl vinyl ether or dihydropyran. These monomers may be polymerized by group transfer polymerization, such as that described in U.S. Pat. No. 4,417,034; free radical polymerization; or other conventional polymerization techniques, such as anionic polymerization.

Group transfer polymerization products highly reproducible, nearly monodisperse (polydispersity less than 1.75 for the polymerization of methacrylate monomers and somewhat higher for acrylate monomers) materials. Group transfer polymerization is particularly adapted to polymerization of methacrylate and acrylate monomers. The molecular weight of the polymer is dependent on the ratio of monomer to initiator; polydispersity is predominantly dependent on the polymerization conditions. Methods for controlling polydispersity in group transfer polymerization are disclosed in I. B. Dicker et al., *Macromolecules*, 1990, Vol. 23, p. 4034.

As will be discussed in more detail hereinbelow, it is essential that the acid labile polymer be substantially soluble in the plasticizer used in the unpatterned layer. Nevertheless, it is preferred that the polymer not be soluble in all proportions. Though the method of the invention can with difficulty be carried out with an homogeneous polymer layer, it is nevertheless preferred that the polymer be present with the plasticizer as a two-phase system. The interface between the phases serves as a path which facilitates diffusion of the acid solution from the patterned layer and contact with the acid labile polymer.

The formation of a two-phase system between the polymer and plasticizer upon solvent removal can easily be observed from the gloss characteristics of the surface of the resultant polymer/plasticizer film. If the film is homogeneous, it will be specularly reflective, i.e. it will have a glossy appearance. On the other hand, if it is in the desired two-phase state, the film will be specularly non-reflective, i.e. it will have a dull, satin or matte surface. In order properly to observe specular reflectivity it is necessary to remove any plasticizer or other liquid which may have migrated to the surface.

Though it is not necessary to do so, it will be realized that mixtures of acid labile polymers and other non-acid labile polymers can be used as binder for the unpatterned layer if it is desired to obtain special properties not otherwise obtainable from the acid labile polymer by itself. However, the acid content of the polymer blend after deprotection must still be sufficient to render the whole layer dispersible upon exposure to the diffused base solution. For example, it may in some instances be advantageous to use a mixture of acid labile polymer with a non-acid labile polymer which has limited compatibility with the acid labile polymer to control the phase structure of the polymer film that is to be patterned. As a result, the acid solution from the patterned layer can be more effectively diffused into the lower layer to attack the regions that are rich in labile acid functions and disperse these regions, thereby causing the film structure to collapse rapidly and become readily dispersible within the imaged areas.

E. Plasticizers

Both the unpatterned layer and the patterned layer preferably contain a substantial amount of plasticizer in which the polymer component of the unpatterned layer is at least partially soluble. The primary function of the plasticizer in both layers is to facilitate diffusion of the acid liquid from the patterning layer into the underlying areas of the unpatterned layer. While it is not absolutely necessary to have plasticizer in both layers, it is nevertheless preferred because it gives greater imaging sensitivity. The plasticizers in the two layers may be the same or different so long as they meet the particular criteria for the layers. The plasticizer in the lower unpatterned layer must (1) be capable of dissolving the polymer in the unpatterned layer, and (2) preferably capable of forming a solid two-phase system with the acid labile polymer in the unpatterned layer. On the other hand, the plasticizer in the patterned layer must be a solvent for the binder polymer in the patterned layer, for the polymer in the unpatterned layer, and for the organic acid.

The amount of plasticizer used in the layers varies widely depending upon the polymer which is used. As was mentioned hereinabove, it is preferred to maximize the amount of plasticizer in the unpatterned layer to minimize the amount of polymer which must be burned off when the layers are thick film pastes. It is preferred that the boiling points of the plasticizers be at least 250C. in order that they remain in the layer as the volatile solvent is driven off by heating. Nevertheless, it is further preferred that the volatility of the plasticizers be such that they can be removed from the system by simple heating if it is desired to reduce the amount of plasticizer. In fact this technique may in some instances be preferred since the removal of plasticizer in this manner leaves holes in the unpatterned film that facilitate diffusion of plasticizer from the patterned layer.

A wide range of plasticizers can be used to facilitate the penetration of the acid into the polymer film that is to be patterned and to adjust the film properties. A plasticizer would be selected which shows reasonable compatibility with the binder and other components of the layers. With acrylic binders, for example, plasticizers can include dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; chlorinated paraffins; and sulfonamide types can be used.

In general, water insoluble plasticizers are preferred for greater high humidity storage stability and environmental operating latitude, but are not required. Suitable plasticizers include: triethylene glycol, triethylene glycol diacetate, triethylene glycol diproprionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropyl naphthalene, diisopropyl naphthalene, poly(propylene glycol), glyceryl tributyrate, diethyl adipate, diethyl sebacate, dibutyl suberate, tributyl phosphate, tris(2-ethylhexyl) phosphate, t-butylphenyl diphenyl phosphate, triacetin, dioctyl phthalate, $C_{12}H_{25}(OCH_2CH_2)_{20}OH$, tris(2-butoxyethyl) phosphate and phthalates such as dicyclohexyl phthalate, dioctyl phthalate, diphenyl phthalate, diundecyl phthalate, butyl benzyl phthalate, 2-ethylhexyl benzyl phthalate.

A unique feature of the invention is that the plasticizer component of the unpatterned layer can be used as the solubilizing component of the unpatterned layer in addition to or even in place of the organic polymer provided it is acid labile in character.

When an acid labile plasticizer is used with an acid labile polymer, it augments the solubilizing effect of the diffused acid by making the acid itself more accessible to the solubilizing action of the acid. On the other hand, when the plasticizer alone is the only component which is solubilized by the diffused acid, the polymer is not itself solubilized, but becomes porous because of the solubilization of the acid labile plasticizer and is therefore more susceptible to the dissolving action of the non-acid labile plasticizer diffused into the layer from the overlying patterned layer.

Suitable acid labile plasticizers include compounds containing acid labile esters of carboxylic acid, sulfonic acid, sulfinic acid, adn phosphonic acid. Preferred acid labile groups are esters of carboxylic acid, represented by the formula:

$$—CO_2—C(R^1)(OR^2)—CH(R^3)(R^4),$$

wherein $R^1$ is hydrogen or alkyl;

$R^2$ is alkyl; and $R^3$ and $R^4$ are each independently hydrogen or alkyl and $R^1$ and $R^2$, $R^1$ and either $R^3$ or $R^4$ when taken together form a 5-, 6- or 7-membered ring.

The more preferred plasticizer is bis(tetrahydropyranyl) phthalate.

F. Organic Acid

The deprotection reactions of the acid labile polymer is initiated with a catalytic amount of acid. The deprotected compounds become ionized in aqueous solution, such as aqueous alkaline solution, and render the composition soluble. Useful acids for this purpose include trifluoroacetic acid, oxalic acid, p-toluenesulfonic acid, trifluoromethanesulfonic acid, p-nitrobenzenesulfonic acid, and the like.

It is preferred that the acid component of the patterning layer be an organic acid. Either liquid acids, low melting acids or acid solutions may be used. If a plasticizer is used in the patterned layer, it is preferred that the acid and plasticizer are mutually soluble.

The amount of acid in the patterning overprint paste or ink must be sufficient to provide a catalytic amount for the deprotection reaction by diffusion to the underlying first layer. Thus depending on the application methods and the formulation of the carriers and the catalytic efficiency of the acid with respect to the acid-labile compound, the patterning layer may contain merely a fraction of 1% by weight of acid or it may contain as much as 90% by weight of acid.

While inorganic acids can be used in practicing the invention, they are not preferred because of environmental and safety considerations. Moreover, they present problems of corrosion with the equipment for their application which are not associated with most organic acids.

G. Solids Components

It should be recognized that the method of the invention can be used to image organic layers alone as well as thick film pastes and other filled layers. When the method is used for thick film pastes, the solids component of the unpatterned layer will generally be a dielectric material, such as glass or a mixture of glass-forming oxides, which will densify and/or sinter when they are fired at, for example, 800°-950° C. The chemical composition of the solids is not by itself important with respect to application of the invention so long as the material is inert to the components of the organic medium. The method of the invention can, of course, be used to pattern polymeric thick film layers which are not fired.

The use of solids in the patterned layer is not always necessary. Nevertheless, the use of finely divided solids is a very useful way of obtaining appropriate rheological properties of the layer for printing and subsequent processing in accordance with the invention. The composition of the solids in the patterned layer is not otherwise important since they are physically removed from the system by washing after completion of the diffusion patterning step.

The particle size of the solids is also not critical. However, it should ordinarily be in the range of 0.5-20 microns in order to be useful for application by screen printing.

H. Patterned Layer Polymer

The primary function of polymers in the patterning layer is to adjust the rheology of the layer consistent with the way it is applied to the unpatterned layer. Therefore, it is not an essential component of the patterned layer in every instance. For example, it is not needed when the layer is applied by ink jet printing. However, when the patterning layer is applied as a thick film paste, the polymer serves both to adjust the rheology of the paste and as a binder for the finely divided solids until they are removed in the washing step.

The nature of the binder polymer is not critical within broad limits so long as the rheological properties of the patterning layer are appropriate for the method of application. However, when the patterned layer is applied as a thick film paste, it is strongly preferred to use cellulosic polymers such as ethyl cellulose as the binder because of its very desirable thixotropic properties. The solvent system is formulated so that the diffused patterned areas can be removed by an aqueous wash or spray.

I. Aqueous Base Solution

The diffusion patterned areas need to be dispersed with an aqueous base solution. To obtain satisfactory removal of the solubilized polymer and residual amounts of acid from the layers, the pH of the aqueous base washing solution should be at least 7 and preferably at least 9 depending on the nature of the acid labile polymer. For example, polyacrylic acid is soluble in tap water while copolymers of benzyl methacrylate and methacrylate and would require a higher pH for dissolution. Optionally, low levels of water soluble surfactants may be present in the wash solution to facilitate the interaction between the acid and the acid labile polymer film.

J. Formulation and Application

The method of the invention is intended primarily for use in making functional layers in the fabrication of electronic components. Typically the patterned layer which contains a dispersibility-changing agent (in this case organic acid) will range from 1 to 30 microns thickness while the first layer can be of much greater thickness, from 10 to 100 microns. The thickness of the patterned layer is usually limited by the method of application, rather than by considerations of operability.

K. Alternative Patterning Methods

It is preferred to carry out the diffusion patterning method of the invention by screen printing a thick film paste. Nevertheless, it can be carried out by other methods including thermal transfer, electrophotography, pen plotters and ink jet printing.

Thermal Transfer: The dispersibility changing agents can be formulated with polymeric binders and other necessary additives to make a hot melt ink composition as practiced by those skilled in the art. The ink composition containing the acid is precoated on a dimensionally stable thin base, e.g., PET film. The ink ribbon is placed in close contact with the thick film substrate with the ink facing the thick film composition. Through the base side of the ink ribbon, a thermal head similar to those used in commercially available computer printers is used to imagewise affect the transfer of the ink composition into the thick film substrate. If the ribbon formulation and the heating conditions are adjusted properly, the heat used to generate the pattern may be adequate to effect the diffusion of the active ingredients into the thick film composition and change its dispersibility behavior simultaneously. The element is then processed as previously described.

Alternatively, the patterning can be effected by an IR laser if an IR absorbing material such as carbon black, graphite or organic dyes, which are very efficient in converting the IR radiation into heat, are added to the formulation. The heat generated in this manner will induce the diffusion of the active ingredients into the thick film substrate.

Typically, waxy and water-repelling types of binder materials are used in formulating hot melt inks. If the process is changed slightly, instead of diffusing the ink into the thick film composition, the ink is overprinted on an aqueously developable organic compound containing composition. The water resistant image can be used as a mask or resist for the subsequent aqueous processing for a positive mode operation.

Electrophotography: The dispersibility changing agents can be formulated with polymeric binders, charge directors and adjuvants to make toner particles which may be dispersed in a liquid carrier medium as practiced by those skilled in the art. The toner particles are imagewise applied to the thick film substrate through the various mechanisms that are familiar to those skilled in the art. At the fusing step, the active ingredients are driven into the thick film composition to affect the dispersibility change for a predetermined solvent system.

Pen Plotters: The dispersibility changing agents are formulated with additives in a water- or solvent-based liquid vehicle. The pattern is generated with a pen through digital commands as in a commercially available plotter. The active ingredients are driven into the thick film composition to affect the desired solubility change. The aqueous ink system is the preferred mode of operation for environmental reasons.

Ink Jet, Liquid Ink: The dispersibility changing agent is formulated with additives in a water- or solvent-based liquid vehicle. The images are generated with an ink jet printhead similar to those found in commercially available computer printers. The liquid vehicle and additives such as plasticizers and surfactants can be used to carry the active ingredients into the underlying polymer layer to effect the solubility change. The use of water-based inks is preferred for environmental reasons.

Ink Jet, Solid Ink: The dispersibility changing agents can be formulated with solid vehicle that melts at an elevated temperature. During printing, the ink droplets are ejected in its melted form according to the digital commands as in those commercially available computer printers to give high resolution images on the thick film composition. Diffusion of the active ingredients into the thick film composition changes the dispersibility in the imaged areas.

The invention will be further illustrated by the following examples.

EXAMPLES

The following procedures were used in the preparation of acid labile polymers:

Preparation of Acid Labile Polymer I

Poly(2-tetrahydropyranyl methacrylate-co-benzyl methacrylate-co-methacrylic acid)

Ethyl acetate (625 mL) was degassed by heating at reflux under argon for 15 min. After cooling to room temperature, 100 g (96.7 mL, 0.567 mole) of benzyl methacrylate and 100 g (98 mL, 0.587 mole) of 2-tetrahydropyranyl methacrylate were added, and the solution was heated with stirring in an oil bath. When the temperature reached 75 C., 0.52 g of VAZO 65 ® (azobisisobutyronitrile) dissolved in a minimum of ethyl acetate was added, and the solution was stirred at 75 C. for 2.5 days. NMR analysis showed 26% residual monomers, so 0.52 g of VAZO 64 was added, and stirring at 75 C. was continued for 5 hr. NMR analysis showed 7.1% residual monomers. The product was precipitated in methanol in a blender and dried at room temperature and 0.1 mm pressure to give 191.8 g of poly(2-tetrahydropyranyl methacrylate-co-benzyl methacrylate-co-methacrylic acid). Titration with standard sodium hydroxide showed the presence of 0.03 mmol of methacrylic acid units per gram of polymer. Gel permeation chromatography showed Mn=23,500, Mw=62,100, Mw/Mn=2.64 (polystyrene standard).

Preparation of Acid Labile Polymer II

(Poly(2-tetrahydropyranyl methacrylate)

A solution of 150 g of 2-tetrahydropyranyl methacrylate in 345 mL of acetone was stirred at reflux under a nitrogen atmosphere for 15 min. Then 3.17 g of azobis-(isobutyronitrile) was added, and refluxing was continued for 6 hr. Gravimetric analysis of an aliquot of the solution showed 85.4% conversion to polymer. The solvent was removed under reduced pressure, and the residue was dissolved in tetrahydrofuran and precipitated in methanol to give, after drying in a vacuum oven at 50 C., 70.8 g of poly(2-tetrahydro-pyranyl methacrylate). Gel permeation chromatography (PMMA standard) showed Mn=12,500, Mw=23,000, Mw/Mn=1.84.

Preparation of Acid Labile Polymer III

(Poly(tetrahydropyranyl acrylate) by Free Radical Polymerization

To an oven-dried 1L round bottom flask equipped with a magnetic stirrer and condenser was added 345 mL of acetone and 150 g (147 mL) of tetrahydropyranyl acrylate. The solution was degassed with nitrogen for 20 minutes. The solution was refluxed under nitrogen for 15 minutes, and then 1.87 g of VAZO 52 were added, and refluxing under nitrogen was continued. After 60 minutes, the solution had become highly viscous, and 150 mL of acetone were added. The solution was stirred at reflux for 7 hours. The resulting poly(tetrahydropyranyl acrylate) was precipitated in hexane and dried in a vacuum oven at 50 C. to give 150 g of product. Titration for carboxylic acid showed 0.07 meq/g. GPC: $\overline{M}_n$=27,100, $\overline{M}_w$=124,000, $\overline{M}_w/\overline{M}_n$=4.6

In the following examples, dielectric compositions were used having the compositions indicated below:

| Ingredient | % Wt. |
|---|---|
| Glass C | 47.36 |
| Glass D | 31.57 |
| Alumina | 6.55 |
| Zirconium Silicate | 8.76 |
| Cobalt Aluminate | 3.00 |
| Titanium Oxide | 2.76 |

| Ingredient | Glass C % Wt. | Glass D % Wt. |
|---|---|---|
| BaO | 12.56 | 11.78 |
| SrO | 10.82 | 10.15 |
| CaO | 6.70 | — |
| ZnO | 16.00 | 21.29 |
| $Al_2O_3$ | 5.50 | 6.90 |
| $SiO_2$ | 46.01 | 47.64 |
| $ZrO_2$ | | |

EXAMPLE 1

A dielectric coating was prepared using the following procedure:

| Ingredient | Amount (Parts by Weight) |
|---|---|
| Dielectric Solids | 15.0 |
| Acid Labile Polymer I | 1.9 |
| Butyl Benzyl Phthalate | 2.1 |
| Terpineol | 4.2 |
| Total | 23.2 |

The above paste composition was prepared in the manner familiar to those skilled in formulation of thick film materials and was prepared for printing as follows:

The materials were processed by printing the dielectric optionally one, two, or three prints, with each print followed by drying 10 to 15 min. at 80° to 90° C. The substrate used was an alumina substrate.

A printing ink was prepared using the following procedure:

| Ingredient | % Wt. |
|---|---|
| p-Toluenesulfonic Acid (Fisher Scientific Co., Pittsburgh PA) | 10 |
| Deionized Water | 90 |
| Total | 100 |

The above mentioned components were stirred until the solid was dissolved completely. The resulting solution was used as a printing ink to generate single dot pattern on the dielectric thick film using a Hewlett Packard Desk Jet® ink jet printer (Hewlett Packard, Palo Alto, Calif.). The imaged element was baked at 80 C. in an oven for 5 min. It was then immersed in a 1% potassium bicarbonate solution at 60 C. with ultrasonic agitation for 2 minutes. Round vias were obtained which were 130 μm wide at the top and 22 μm deep.

EXAMPLE 2

A dielectric coating was prepared using the following procedure:

| Ingredient | Amount (Parts by Weight) |
|---|---|
| Dielectric Solids | 15.0 |
| Acid Labile Polymer I | 1.45 |
| Acid Labile Polymer II | 0.97 |
| Butyl Benzyl Phthalate | 2.47 |
| Brij 30 | 1.45 |
| Terpineol | 4.65 |
| Total | 26.00 |

The above paste composition was prepared in the manner familiar to those skilled in formulation of thick film materials and was printed on an alumina substrate as described in Example 1.

A printing ink was prepared using the following procedure:

| Ingredient | Amount % Wt. |
|---|---|
| p-Toluenesulfonic Acid (Fisher Scientific Co., Pittsburgh PA) | 20 |
| Butyl Carbitol | 10 |
| Brij 30 | 10 |
| Deionized Water | 60 |
| Total | 100 |

The above mentioned components were stirred until the solids were dissolved completely. The resulting ink was filled into an ink jet pen and used to print single dot pattern on the dielectric film using a Hewlett Packard Desk Jet® ink jet printer (Hewlett Packard Co., Palo Alto, Calif.). The imaged element was baked at 125 C. in an oven for 4 minutes, then processed in a 2% potassium bicarbonate solution at 55 C. with agitation for 4 minutes. 30 μm deep, 300 μm wide round vias were obtained.

We claim:

1. A method for making patterns in organic polymer layers comprising the sequential steps:

A. Applying to a substrate an unpatterned first layer comprising a solid acid labile polymer;

B. Applying to the unpatterned first layer a patterned second layer comprising a liquid solution of organic acid and volatile solvent;

C. Heating the patterned second layer to effect removal of the volatile solvent from the layer and diffusion of the organic acid into the underlying areas of the first layer whereby the acid labile polymer in the underlying areas of the first layer becomes solubilized by reaction with the organic acid; and D. Washing the layers with aqueous solution having a pH of at least 7 to remove the solubilized acid labile polymer from the patterned areas of the first layer.

2. The method of claim 1 in which the unpatterned first layer also contains a plasticizer.

3. The method of claim 1 in which the patterned first layer is comprised of a mixture of two or more polymers which are sufficiently incompatible as to render the unpatterned layer specularly nonreflective.

4. The method of claim 2 in which the acid labile polymer has limited solubility in the plasticizer and the weight ratio of polymer to plasticizer is such that the unpatterned layer is specularly nonreflective.

5. The method of claim 2 in which the plasticizer is acid labile.

6. The method of claim 1 in which the patterned second layer contains a plasticizer for the polymer of the unpatterned first layer.

7. The method of claim 1 in which the unpatterned first layer contains finely divided dielectric solids.

8. The method of claim 7 in which the unpatterned first layer is a thick film paste.

9. A method for making patterns in organic polymer layers comprising the sequential steps:

A. Applying to a substrate an unpatterned first layer comprising a solid organic polymer and an acid labile plasticizer;

B. Applying to the unpatterned first layer a patterned second layer comprising a liquid solution of organic acid and volatile solvent;

C. Heating the patterned second layer to effect removal of the volatile solvent from the layer and diffusion of organic acid into the underlying areas of the first layer whereby the acid labile plasticizer becomes solubilized by reaction with the organic acid; and D. Washing the layers with aqueous base solution having a pH of at least 7 to remove the solubilized acid labile plasticizer and polymer from the patterned areas of the first layer.

10. The method of claim 9 in which the polymer has limited solubility in the plasticizer and the weight ratio of polymer to plasticizer is such that the unpatterned layer is specularly nonreflective.

11. The method of claim 9 in which the unpatterned first layer is comprised of a mixture of polymers which are sufficiently incompatible that the layer is specularly nonreflective.

12. The method of claim 9 in which the second patterning layer contains a plasticizer for the polymer in the unpatterned first layer.

13. The method of claim 9 in which the unpatterned first layer contains dielectric solids dispersed therein.

* * * * *